(12) United States Patent
Gibson et al.

(10) Patent No.: US 8,970,263 B2
(45) Date of Patent: Mar. 3, 2015

(54) SEMICONDUCTOR DEVICE DRIVING UNIT

(71) Applicant: Control Techniques Limited, Newtown (GB)

(72) Inventors: Richard Samuel Gibson, Shrewsbury (GB); Richard Mark Wain, Newtown (GB); Robert Anthony Cottell, Montgomery (GB); Robert Gwyn Williams, Shrewsbury (GB)

(73) Assignee: Control Techniques Limited, Newtown (GB)

( * ) Notice: Subject to any disclaimer, the term of this patent is extended or adjusted under 35 U.S.C. 154(b) by 0 days.

(21) Appl. No.: 14/030,402

(22) Filed: Sep. 18, 2013

(65) Prior Publication Data

US 2014/0077848 A1    Mar. 20, 2014

(30) Foreign Application Priority Data

Sep. 19, 2012   (GB) .................................. 1216743.3

(51) Int. Cl.
*H03K 3/00* (2006.01)
*H03K 17/14* (2006.01)
*H03K 17/16* (2006.01)

(52) U.S. Cl.
CPC .............. *H03K 17/14* (2013.01); *H03K 17/168* (2013.01); *H03K 17/163* (2013.01)
USPC .............. 327/109; 326/83; 327/170; 327/172

(58) Field of Classification Search
USPC ......... 327/108–112, 427, 434, 437, 170, 172; 326/82, 83
See application file for complete search history.

(56) References Cited

U.S. PATENT DOCUMENTS

| | | | | |
|---|---|---|---|---|
| 5,140,201 A | * | 8/1992 | Uenishi | 327/108 |
| 5,808,504 A | * | 9/1998 | Chikai et al. | 327/434 |
| 5,936,387 A | * | 8/1999 | Tabata et al. | 323/225 |
| 5,986,484 A | * | 11/1999 | Kimata | 327/108 |
| 6,271,708 B1 | * | 8/2001 | Hoshi et al. | 327/377 |

(Continued)

FOREIGN PATENT DOCUMENTS

| | | |
|---|---|---|
| EP | 0817381 | 1/1998 |
| EP | 0978942 | 2/2000 |

(Continued)

OTHER PUBLICATIONS

"Mitsubishi Electric Advance", vol. 113, 2006.*

*Primary Examiner* — Lincoln Donovan
*Assistant Examiner* — Thomas Skibinski
(74) *Attorney, Agent, or Firm* — Harness, Dickey & Pierce, P.L.C.

(57) ABSTRACT

A semiconductor device driving unit to supply a drive signal to a gate of a semiconductor switching device, the semiconductor device driving unit comprising: a plurality of gate impedance circuits selectably connectable to the gate of the semiconductor switching device; and a selector to select one or more of the gate impedance circuits to connect to the semiconductor switching device. Also provided is a method of supplying a drive signal to a gate of a semiconductor switching device, the method comprising: selecting one or more of a plurality of gate impedance circuits to be connected to the gate of the semiconductor switching device based on one or more operating conditions and stored data relating to the one or more operating conditions; and connecting the selected one or more of the gate impedance circuits to the semiconductor switching device.

11 Claims, 4 Drawing Sheets

(56) References Cited

U.S. PATENT DOCUMENTS

| | | |
|---|---|---|
| 6,542,012 B2 | 4/2003 | Kim |
| 6,943,588 B1* | 9/2005 | Luo et al. .................. 326/86 |
| 7,206,179 B2* | 4/2007 | Miyamoto .................. 361/118 |
| 7,274,243 B2 | 9/2007 | Pace et al. |
| 8,080,988 B2 | 12/2011 | Hurtz et al. |
| 2007/0200613 A1* | 8/2007 | Ishikawa et al. .......... 327/427 |
| 2010/0079191 A1* | 4/2010 | Deboy ....................... 327/379 |
| 2010/0090728 A1* | 4/2010 | Logiudice et al. ......... 327/108 |
| 2011/0273206 A1* | 11/2011 | Lee .............................. 327/109 |
| 2011/0273220 A1 | 11/2011 | Lin et al. |
| 2012/0229942 A1* | 9/2012 | Hussein et al. ............. 361/57 |

FOREIGN PATENT DOCUMENTS

| | | |
|---|---|---|
| EP | 1881587 | 1/2008 |
| EP | 2418776 | 2/2012 |
| WO | 2006/052667 | 5/2006 |

\* cited by examiner

SEMICONDUCTOR DEVICE DRIVING UNIT

CROSS-REFERENCE TO RELATED APPLICATIONS

This application claims the benefit and priority of Great Britain Patent Application No. 1216743.3 filed Sep. 19, 2012. The entire disclosure of the above application is incorporated herein by reference.

BACKGROUND

Semiconductor device driving units are conventionally used to generate a three phase AC voltage to drive a synchronous motor from a variable speed drive. Such a drive unit may be used in electric vehicles, although they have other uses in other fields. Semiconductor device driving units may employ a number of gate driven semiconductor devices, for example IGBTs (Insulated-Gate Bipolar Transistor) or MOSFETs (Metal-Oxide-Semiconductor Field-Effect Transistor).

SUMMARY

IGBTs and MOSFETs are semiconductor devices that are driven by a gate-emitter voltage Vge and can be turned on and off by an input voltage signal at the gate. The term "turn on switching" means switching from a collector-emitter cut off state to a collector-emitter conductor state. The term "turn-off switching" means switching from a collector-emitter conductor state to a collector-emitter cut off state.

Examples of known driving units to control the switching trajectories of the semiconductor switching device in the driving unit may be found in the following documents: European patent application no. 2418776; International patent application no. WO2008/153631, European patent application no. EP1881587 and European patent application no. 0817381.

DRAWINGS

The technique will be described further, by way of example only, with reference to the accompanying drawings in which.

DETAILED DESCRIPTION

Figure 1:
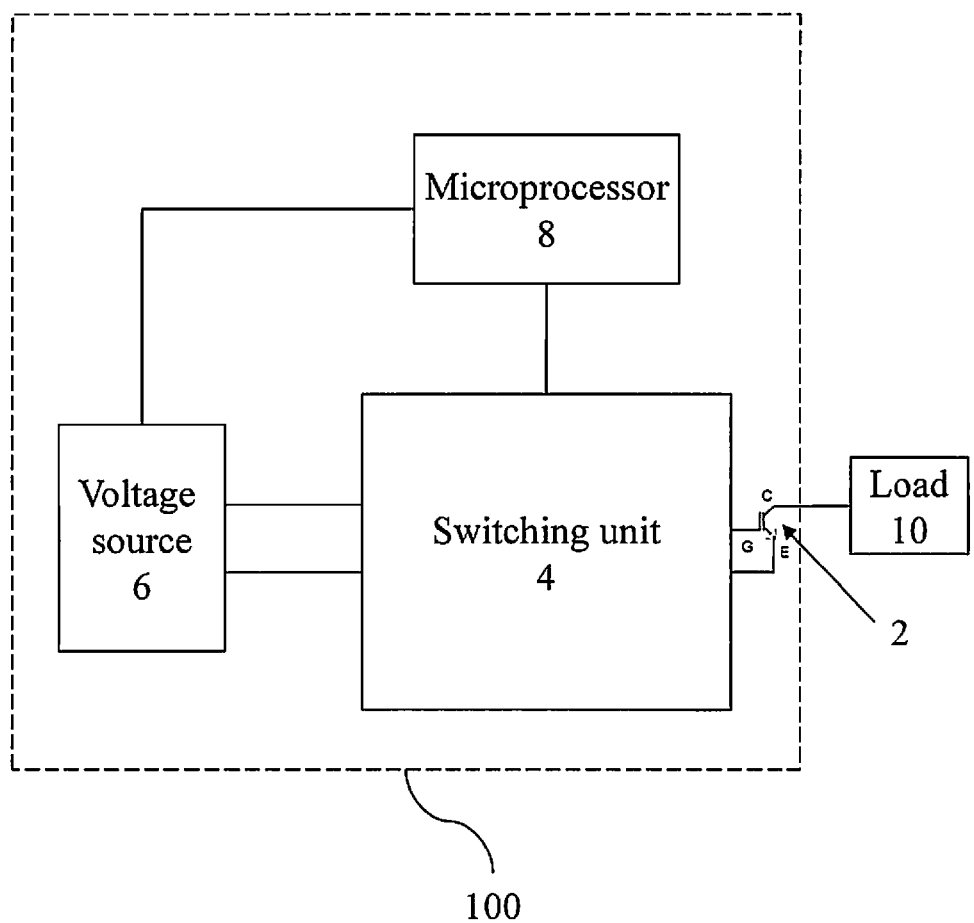
FIG. 1 shows an example of a semiconductor device driving unit.

As shown in FIG. 1, a semiconductor device driving unit 100 comprises a semiconductor switching device 2 (for example an insulated gate bipolar transistor IGBT or a MOSFET), a switching unit 4, a drive voltage 6 and a microprocessor 8. The microprocessor 8 controls the switching of the switching unit 4 and the voltage source 6 to effect switching of the semiconductor switching device 2 and produce a drive signal for a load 10. For simplicity, the driving unit 100 of FIG. 1 comprises a single semiconductor switching device 2 (for example an insulated gate bipolar transistor IGBT or a MOSFET). However it will be appreciated that the driving unit 100 may comprises a plurality of semiconductor switching devices 2 (for example insulated gate bipolar transistor IGBTs or MOSFETs), with associated switching units 4 and drive voltages controlled by the microprocessor 8.

Figure 2:
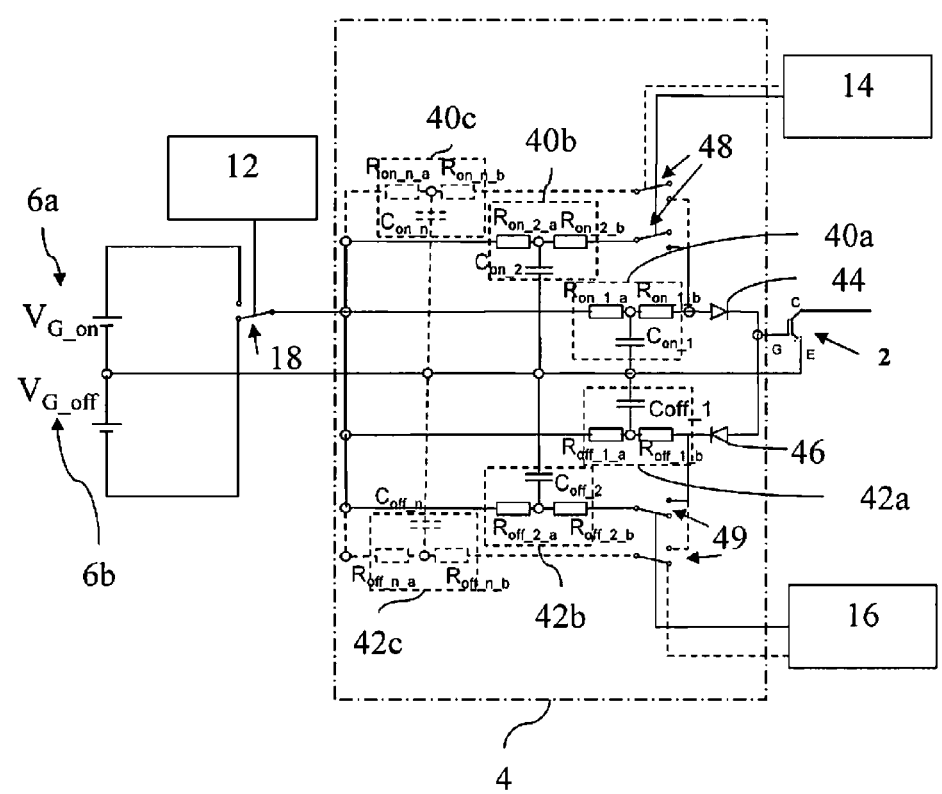
FIG. 2 shows in greater detail an example of a first embodiment of a semiconductor device driving unit.

FIG. 2 shows an embodiment with further details regarding the switching unit 4 and the voltage source 6. It is proposed that multiple gate resistors and capacitor networks be used for each IGBT gate drive.

The switching unit 4 comprises a plurality of gate impedance circuits 40, 42 and diodes 44, 46. The diodes 44, 46 control the current flow when the switching device 2 is turned on or off. In the on state, current flows via the gate impedance circuits 40 in the on loop of the switching device 2. In the off state, current flows via the gate impedance circuits 42 in the off loop of the switching device 2. Each gate impedance circuit 40, 42 comprises one or more resistors R and one or more capacitors C. For instance first gate impedance circuit 40a comprises resistors Ron_1_a and Ron_1_b and the capacitor C1_on. Resistors Ron_1_a and Ron_1_b may comprise a single resistor or two resistors in series as shown. The second gate impedance circuit in the on loop, gate impedance circuit 40b, comprises resistors Ron_2_a and Ron_2_b and capacitor Con_2. A third gate impedance circuit 40c is shown in dotted line and comprises resistors Ron_n_a and Ron_n_b and capacitor Con_n to show that as many preset gate impedance circuits 40 as required may be provided. Similarly in the off loop, a first gate impedance circuit 42a comprises resistors Roff_1_a and Roff_1_b and capacitor Coff_1. A second gate impedance circuit 42b comprises resistors Roff_2_a and Roff_2_b and capacitor Coff_2. Similarly, in dotted lines, a third off gate impedance circuit 42c is shown comprising resistors Roff_n_a and Roff_n_b and capacitor Coff_n. As many off gate impedance circuits 42 may be provided as necessary.

In use, the microprocessor 8 provides a first control signal (indicated by box 12) to a microprocessor controllable switch 18 to control the switching voltage 6 for the semiconductor switching device 2. Voltage 6a is the on voltage and voltage 6b is the off voltage. The voltage determines whether the semiconductor switching device 2 is in the on or the off condition. The control signal 12 determines whether the on drive voltage 6a or the off drive voltage 6b is provided to the semiconductor switching device 2. The microprocessor 8 provides a second control signal (indicated by box 14) to a microprocessor controllable switch 48 to control which of the gate impedance circuits 40 are connected during the on cycle of the semiconductor switching device 2. The microprocessor 8 provides a third control signal (indicated by box 16) to a microprocessor controllable switch 49 to control which of the off gate impedance circuits 42 are connected during the off cycle of the switching. The selection unit comprising the control signals 14 and 16 and associated switches 48, 49 respectively therefore determines the selectable impedance gate drive circuit(s) 40, 42 selected at a given time.

The semiconductor device driving unit 100 is used to supply a drive signal to a gate of a semiconductor switching device 2. The semiconductor device driving unit 100 comprises a plurality of gate impedance circuits 40, 42 connectable in a selectable manner to the semiconductor switching device 2. Data is stored defining which one or more gate impedance circuits 40, 42 to connect to the semiconductor switching device 2 based on specific intended operating conditions of the semiconductor device driving unit 100. A processor 8 selects one or more of the gate impedance circuits 40, 42 to connect to the semiconductor switching device based on the specific intended operating conditions and the stored data.

The choice of gate impedance circuit 40, 42 used to drive the semiconductor switching device 2 (e.g. an IGBT) strongly influences the measured radiated emissions, conducted emissions, and switching loss of the driving unit. The proposed gate drive can control the selected gate drive impedance to suit the needs of the application.

The selection of the appropriate network(s) 40, 42 can take place using a command from the variable speed drive (VSD) microprocessor 8. This may be for the purpose for instance of any of the following functions:
1) Reduction of radiated emissions at low output phase currents.
2) Increase gate resistance across entire operating range to reduce conducted emissions and allow the use of longer drive—motor cables. This can be selected based on the operating IGBT switching frequency.
3) Selection of optimum gate drive for use with second sourcing IGBT manufacturers
4) Reduction of the thermal fatigue due to thermal cycling.

A positive voltage 6a ($V_{G\_on}$) is applied to the gate drive of the semiconductor switching device 2 to initiate the switching on of the IGBT with the microprocessor (uP) on/off control illustrated with the box 12 and switch 18. The current from the gate power supply flows through the selected impedance network(s) 40, as determined by the microprocessor selectable switches 48 controlled by the signal from the microprocessor as indicated by box 14. During turn off, the uP on/off control signal indicated by box 12 causes a negative voltage 6b ($V_{G\_off}$) to be applied to the gate drive of the switching device 2. This removes the charge from the gate of the switching device 2 via the selected network(s) 42$_x$. The number of networks 40, 42 used can be increased as required for both turn on and off operation.

FIG. 2 shows an implementation in which a plurality of gate impedance networks are provided in both the on loop and the off loop, with each gate impedance network 40 or 42 being in a full bridge arrangement (i.e. the gate impedance circuit 40a is always connected and the additional gate impedance circuits 40b, 40c may be connected in parallel with the first gate impedance circuit 40a, either separately or in parallel with each other). However it is also envisaged that the gate impedance networks 40, 42 may be connected in other arrangements, e.g. in series, in parallel, in combination with one or more other gate impedance networks, in isolation of other gate impedance networks etc.

Reduction of Radiated Emissions

It has been identified through research that the radiated emissions from a single fixed gate resistance reduce with increasing IGBT collector current. The proposed technique utilises this discovery by allowing the selection from a number of defined gate impedance networks 40, 42 by a microprocessor 8 from a knowledge of the output phase current $I_c$. The appropriate gate impedance over the operating current range may be selected from the gate impedance circuits 40, 42.

Altering the gate drive impedance circuit 40, 42 adjusts the transient behaviour of the collector current Ic and voltage during switching. With the proposed switching unit, the optimum gate drive impedance can be selected for each output phase current to minimise switching loss while maintaining compliance with radiated emissions limits.

To this end, the microprocessor has stored procedures to determine the selection of the gate impedances based on the required output phase current of the switching device. For instance, for the required output phase current the microprocessor stores a look up table, an example of which is shown in Table 1 for two output phase currents, although data may be stored for other output phase current:

TABLE 1

| Required output phase current | On gate impedance | Off gate impedance |
|---|---|---|
| Ia | 40a | 42a |
| Ib | 40b | 42b |

The device drive unit 100 may then be set up by a user in dependence on the required output phase current. For instance, on set up a user enters the required output phase current (say Ib) and the microprocessor looks up in the look up table which gate impedances are required for this output phase current. In the example above, this causes gate impedance circuits 40b and 42b to be selected in the on and off part of the switching cycle respectively.

Increase Cable Length at High Switching Frequencies

The length of cable which can be used with a load is often restricted by the conducted emissions. The conducted emissions increase with switching frequency for a given length of cable. The conducted emissions are known to be related to the dV/dt of the IGBT switching transients.

Using the proposed gate drive, the choice of gate impedance circuit 40, 42 may be selected for the operational switching frequency and cable length. When details of the connected cable are entered, the microprocessor 8 recalculates the change in switching loss to compensate ensuring the product remains protected. It is possible to further expand this to select the gate impedance circuit 40, 42 for the output phase current.

To this end, the microprocessor has stored procedures to determine the selection of the gate impedances based on the operational switching frequency and cable length. For instance, for the operational switching frequency and cable length the microprocessor stores a look up table, an example of which is shown in Table 2 for two operational switching frequencies and two cable lengths. Of course the stored data may relate to many more combinations of operational switching frequency and cable length:

TABLE 2

| operational switching frequency | cable length | On gate impedance | Off gate impedance |
|---|---|---|---|
| A | X | 40a | 42a |
| B | X | 40b | 42a + 42b |
| A | Y | 40a + 40b | 42a |
| B | Y | 40a + 40b | 42b |

The device drive unit 100 may then be set up by a user in dependence on the required operational switching frequency and cable length. For instance, on set up a user enters the required operational switching frequency and cable length and the microprocessor looks up in the look up table which gate impedances are required for these intended conditions. In the example above, for an operational switching frequency of B and a cable length of X this causes gate impedance circuit

40b to be selected in the on part of the switching cycle and impedance circuits 42a and 42b to be selected in the off part of the switching cycle.

Selection of Optimal Gate Drive for Use with Second Source IGBT Manufacturers

With the requirements for security of component supplies, is it often required to have a second manufacture supply a similar semiconductor switching device (e.g. a IGBT) for drive production. To achieve the optimum switching performance from both IGBTs from different manufacturers, different impedance networks 40, 42 can be selected determined by the installed semiconductor switching device 2.

To this end, the microprocessor has stored procedures to determine the selection of the gate impedances based on the switching device used. For instance, for each defined switching device the microprocessor stores a look up table, an example of which is shown in Table 3 for three switching devices. Of course the stored data may relate to any number of switching devices:

TABLE 3

| Switching device | On gate impedance | Off gate impedance |
| --- | --- | --- |
| IGBT1 | 40a | 42a |
| IGBT2 | 40b | 42b |
| MOSFET1 | 40c | 42b |

The device drive unit 100 may then be set up by a user in dependence on the installed switching device. For instance, on set up a user enters the switching device used and the microprocessor looks up in the look up table which gate impedances are required for these intended conditions. In the example above, for a switching device IGBT2 this causes gate impedance circuits 40b and 42b to be selected in the on and off part of the switching cycle respectively.

Reduction of Thermal Fatigue Due to Thermal Cycling

It is also possible that a selectable gate impedance could be used to reduce the change in temperature across the junction (delta Tj) in the IGBT for specific applications to increase product lifetime. When a low collector current is measured, the gate impedance circuit 40, 42 may be altered so that the power loss of the semiconductor switching device 2 is maintained relatively constant over the cyclic application. This aims to reduce thermal fatigue of the semiconductor switching device.

To this end, the microprocessor has stored procedures to determine the selection of the gate impedances based on the measured collector current Ic. For instance, for each defined collector current Ic the microprocessor stores a look up table, an example of which is shown in Table 4 for three collector currents. Of course the look up table may relate to any number of collector currents:

TABLE 4

| Measured collector current Ic | On gate impedance | Off gate impedance |
| --- | --- | --- |
| A | 40a | 42a |
| B | 40b | 42b |
| C | 40c | 42b |

The device drive unit 100 may then be set up by a user in dependence on the measured collector current. For instance, on set up a user enters the details of the measured collector current and the gate impendence to be selected when that collector current is measured and, in operation, the microprocessor looks up in the look up table which gate impedances are required for these intended conditions. In the example above, when a measured collector current in a device equals C this causes gate impedance circuits 40c and 42b to be selected in the on and off part of the switching cycle respectively.

Figure 3:
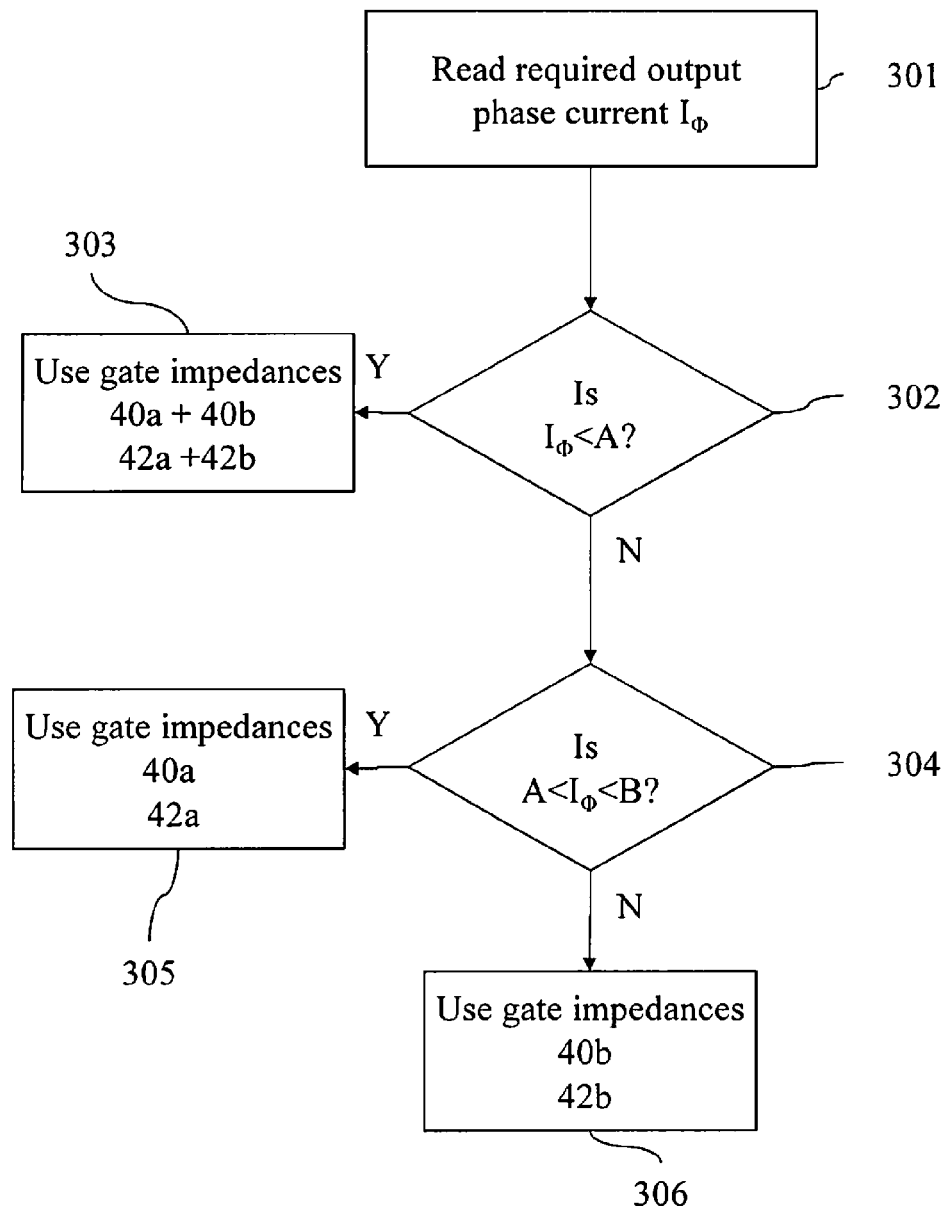
FIG. 3 shows an example procedure to be executed to determine the gate impedance circuits to be connected.

The above examples of look up tables are examples only. It will be clear to a skilled person that the look up tables may include combinations of variables not disclosed above (e.g. defined gate impedances for all combinations of the variables discussed above) and that the data may be stored in others formats than look-up tables. For instance, the data may be stored in the form of procedures or routines to be executed. For example, FIG. 3 shows an example procedure to be executed to determine the gate impedance circuits to be connected for a required output phase current (similar to the example discussed above in Table 1). At operation 301, the required output phase current IΦ is read. If IΦ is less than a value A (operation 302) then the gate impedances 40a+40b and 42a+42b are connected (operation 303). If the required output phase current IΦ is greater than a value A and less than a value B (operation 304) then the gate impedances 40a and 42a are connected (operation 305). If the required output phase current IΦ is greater than a value B (operation 304) then the gate impedances 40b and 42b are connected (operation 306). Similar routines may be stored for other intended operating conditions, for example those operating conditions discussed above in relation to Tables 2 to 4.

A conflict may arise between gate impedance circuit selections for different intended operating conditions. In the case of conflict, the highest gate impedance option for the on loop and the off loop may be selected.

Selection of the gate impedance circuit(s) and connection of the selected gate impedance circuit(s) to the gate of the semiconductor switching device 2 are typically preformed before switching of the device occurs.

Figure 4:
FIG. 4 shows an example of the collector current Ic during the turn-on switching of the semiconductor switching device.
Figure 5:
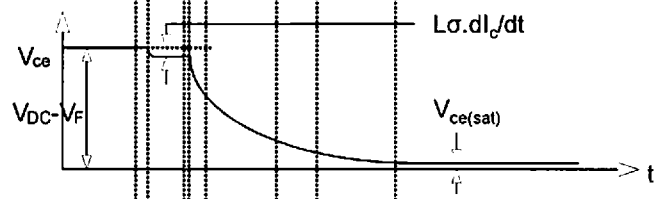
FIG. 5 shows an example of the collector-emitter voltage Vce during the turn-on switching of the semiconductor switching device.
Figure 6:
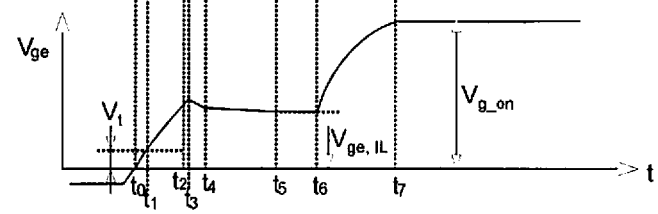
FIG. 6 shows an example of the gate-emitter voltage Vge respectively during the turn-on switching of the semiconductor switching device.
Figure 7:
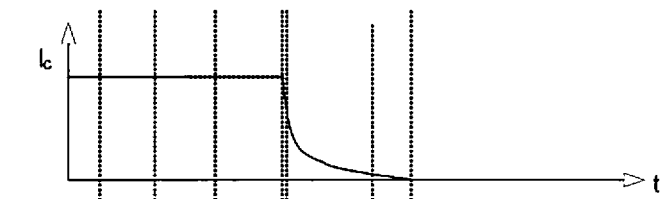
FIG. 7 shows an example of the collector current Ic during the turn-off switching of the semiconductor switching device.
Figure 8:
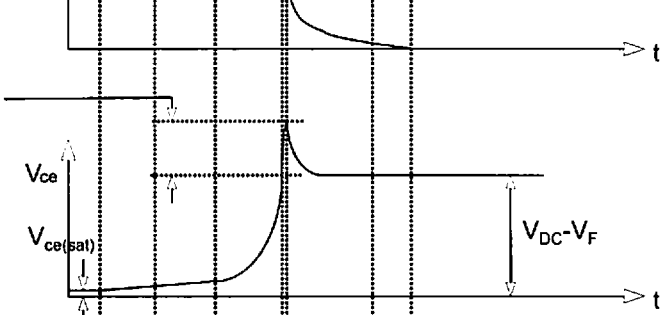
FIG. 8 shows an example of the collector-emitter voltage Vce during the turn-off switching of the semiconductor switching device.
Figure 9:
FIG. 9 shows an example of the gate-emitter voltage Vge during the turn-off switching of the switching semiconductor device.

FIGS. 4 to 9 show example outputs possible with selecting gate impedances based on certain conditions of the switching device. FIGS. 4 to 6 show the collector current Ic, the collector-emitter voltage Vce and the gate-emitter voltage Vge respectively during the turn-on switching of the switching device. FIGS. 7 to 9 show the collector current Ic, the collector-emitter voltage Vce and the gate-emitter voltage Vge respectively during the turn-off switching of the switching device. Vt is the threshold voltage of the respective diode 44, 46, VF is the forward voltage of the respective diode 44, 46, Vge, IL is the gate-emitter voltage Vge at load current IL.

During turn on, the ramp rate of Vge strongly influences the collector current Ic ramp rate and the Vce ramp rate (as shown in FIGS. 4 to 6 between time t1 and t6). The gate impendence 40 switched in during turn-on switching is therefore selected to control the ramp rates of both Ic and Vce to limit radiated and conducted emissions, based on the operating characteristics of the driving unit (for instance: the required output phase current of the switching device; the length of cable connecting the semiconductor device driving unit to a load; the required operational switching frequency of the switching device; the switching device of the driving unit; the collector current of the switching device to maintain a relatively constant the power loss during switching).

During turn off switching, Vce tends to overshoot the required level (as shown in FIG. 8 after time t3). The gate impedance 42 switched in during turn-off switching is therefore selected to minimise this overshoot, based on the operating characteristics of the driving unit (for instance: the required output phase current of the switching device; the length of cable connecting the semiconductor device driving unit to a load; the required operational switching frequency of the switching device; the switching device of the driving unit; the collector current of the switching device to maintain a relatively constant the power loss during switching).

The data stored for specific intended operating conditions are typically determined empirically by experimenting with combinations of resistors and capacitors for each given operating condition to be considered. Clearly the more gate impedance circuit options there are, the more complicated and device intensive the switching circuit 4 becomes. Each specific implementation will determine the number of on gate impedance circuits 40 and the number of off gate impedance circuits 42 that are justified. Once determined, the microprocessor may be programmed with the relevant procedures and stored data (e.g. look up tables) for the specific intended operating conditions.

What is claimed is:

1. A semiconductor device driving unit to supply a drive signal to a gate of a semiconductor switching device, the semiconductor device driving unit comprising:
   a plurality of gate impedance circuits selectably connectable to the gate of the semiconductor switching device, each gate impedance circuit including at least one resistor and at least one capacitor;
   a selector to select one or more of the gate impedance circuits to connect to the semiconductor switching device; and
   a microprocessor to control the selection of the one or more gate impedance circuits, the microprocessor having stored procedures to determine the selection of the one or more gate impedance circuits during set up, wherein the procedures to determine the selection of the one or more gate impedance circuits relate to one or more intended operating conditions entered by a user during set up, and wherein the microprocessor is configured to connect the one or more selected gate impedance circuits to the semiconductor switching device prior to switching of the semiconductor switching device.

2. The semiconductor device driving unit of claim 1 wherein the intended operating conditions relate to a required output phase current of the switching device.

3. The semiconductor device driving unit of claim 1 wherein the intended operating conditions relate to a length of cable connecting the semiconductor device driving unit to a load.

4. The semiconductor device driving unit of claim 1 wherein the intended operating conditions relate to a required operational switching frequency of the semiconductor switching device.

5. The semiconductor device driving unit of claim 1 wherein the intended operating conditions relate to a type of the semiconductor switching device of the driving unit.

6. The semiconductor device driving unit of claim 1 wherein the intended operating conditions relate to a collector current of the semiconductor switching device to maintain a relatively constant power loss during switching.

7. The semiconductor device driving unit of claim 1 further comprising the semiconductor switching device.

8. The semiconductor device driving unit of claim 1 wherein the stored procedures comprise look up tables defining the one or more gate impedance circuits to be selected for the intended operating conditions.

9. A variable speed drive including the semiconductor device driving unit of claim 1.

10. A variable speed drive including a plurality of semiconductor device driving units according to claim 1.

11. A method of supplying a drive signal to a gate of a semiconductor switching device, the method comprising:
    selecting one or more of a plurality of gate impedance circuits to be connected to the gate of the semiconductor switching device based on one or more intended operating conditions entered by a user during set up and stored data relating to the one or more intended operating conditions, each gate impedance circuit including at least one resistor and at least one capacitor; and
    connecting the selected one or more of the gate impedance circuits to the semiconductor switching device, wherein the selected one or more gate impedance circuits are connected to the semiconductor switching device prior to switching of the semiconductor switching device.

* * * * *